US007923688B2

(12) United States Patent
Gregoire et al.

(10) Patent No.: US 7,923,688 B2
(45) Date of Patent: Apr. 12, 2011

(54) MULTIPLE-BAND DETECTOR USING FREQUENCY SELECTIVE SLOTS

(75) Inventors: Daniel J. Gregoire, Thousand Oaks, CA (US); Andrew T. Hunter, Woodland Hills, CA (US)

(73) Assignee: Raytheon Company, Waltham, MA (US)

( * ) Notice: Subject to any disclaimer, the term of this patent is extended or adjusted under 35 U.S.C. 154(b) by 59 days.

(21) Appl. No.: 11/981,203

(22) Filed: Oct. 31, 2007

(65) Prior Publication Data
US 2009/0108203 A1    Apr. 30, 2009

(51) Int. Cl.
*G01J 5/02* (2006.01)
(52) U.S. Cl. ..................................................... 250/338.1
(58) Field of Classification Search ............... 250/338.1; 257/E31.11, E31.121, E31.123, E31.127
See application file for complete search history.

(56) References Cited

U.S. PATENT DOCUMENTS

| | | | |
|---|---|---|---|
| 5,399,206 A | 3/1995 | De Lyon | |
| 7,289,422 B2 * | 10/2007 | Rettner et al. | 369/300 |
| 7,456,383 B2 * | 11/2008 | Kim et al. | 250/226 |
| 2003/0103150 A1 | 6/2003 | Catrysse et al. | |
| 2005/0121599 A1 | 6/2005 | Mouli | |
| 2005/0233493 A1 | 10/2005 | Augusto | |
| 2005/0275934 A1 * | 12/2005 | Ballato et al. | 359/321 |
| 2006/0018211 A1 * | 1/2006 | Ueyanagi et al. | 369/44.23 |
| 2006/0152306 A1 * | 7/2006 | Ito et al. | 333/219.1 |
| 2006/0175551 A1 * | 8/2006 | Fan et al. | 250/353 |
| 2006/0273245 A1 * | 12/2006 | Kim et al. | 250/226 |
| 2007/0194999 A1 * | 8/2007 | Morton | 343/767 |
| 2010/0110430 A1 * | 5/2010 | Ebbesen et al. | 356/331 |

OTHER PUBLICATIONS

Robert C. Keller, et al, Reaction Chemistry and Resulting Surface Structure of HgCdTe Etched in CH4/H2 and H2 ECR Plasmas, Journal Elec Mat, vol. 24, No. 9, 1995, p. 1155-1160.
Robert C. Keller, et al, Dry Etching of Hg1-xCdTe Using Ch4/H2/Ar/N2 Electron Cycoltron Resonance Plasmas, Journal Elec Material, vol. 25, No. 8, 1996, p. 1270-1275.
J.D. Benson, et al, The Influence of Photoresist Feature Geometry on ECR Plasma Etched HgCdTe Trenches, Material Infrared Detectors, Proceeding SIPE, vol. 4795, 2002, p. 129-135.
Andrea Neto, et al, Infinite Bandwidth Long Slot Array Antenna, IEEE Antennas and Wireless Propagation Letters, vol. 4, 2005, p. 75-78.

* cited by examiner

*Primary Examiner* — David P Porta
*Assistant Examiner* — David S Baker
(74) *Attorney, Agent, or Firm* — Pillsbury Winthrop Shaw Pittman LLP

(57) ABSTRACT

An optical detector pixel element. The novel pixel element includes a metallic substrate having a plurality of resonant apertures, each aperture adapted to resonantly transmit electromagnetic energy in a distinct frequency band, and a plurality of detectors adapted to detect the energy transmitted by the apertures. Each aperture is adapted to collect energy incident on an area larger than the aperture and focus the energy into a smaller, localized region in which one or more of the detectors is placed. The plural apertures are positioned such that they collect energy incident on a substantially common area, but are of different sizes such that they are resonant to different frequencies. Energy in different frequency bands are therefore funneled through different apertures. In an illustrative embodiment, several identical pixel elements are joined together to form an array.

17 Claims, 5 Drawing Sheets

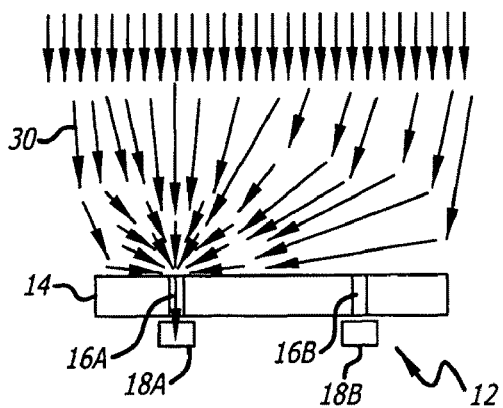
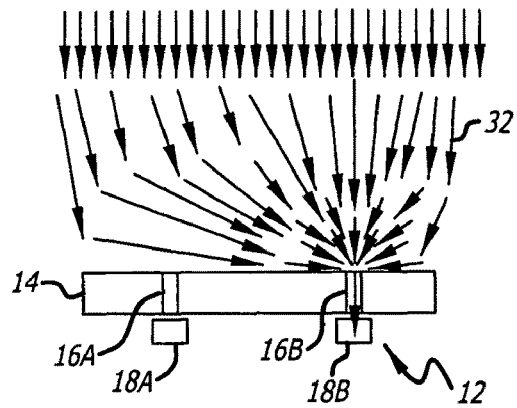
FIG. 3a  FIG. 3b
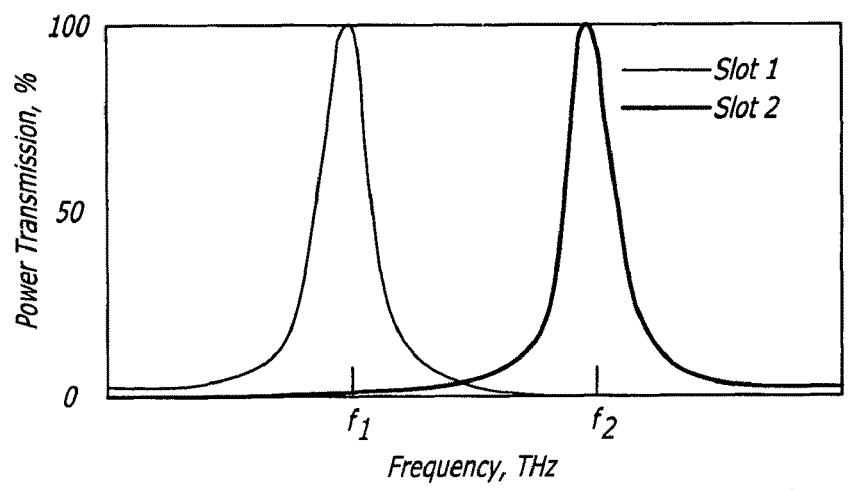
FIG. 4

MULTIPLE-BAND DETECTOR USING FREQUENCY SELECTIVE SLOTS

BACKGROUND OF THE INVENTION

1. Field of the Invention

The present invention relates to optical detectors. More specifically, the present invention relates to systems and methods for simultaneously detecting multiple frequency bands.

2. Description of the Related Art

Imaging systems typically use an array of detector elements to generate an image of a target area. Each individual detector element measures the intensity of energy (such as infrared or visible light) incident upon the detector element, and this measurement is then used to form one pixel of the output image.

Conventional infrared imaging arrays typically have a single detector element per pixel and can only detect energy in one frequency band. In certain applications, however, it would be advantageous to be able to simultaneously image multiple frequency bands. For example, an important application of imaging devices is infrared imaging of military targets. The ability to simultaneously image multiple frequency bands could make it easier to identify targets via their infrared signatures.

Prior approaches to detecting multiple frequency bands include filter arrays, dispersive systems, and vertically stacked photodiodes. Filter arrays are commonly used in color digital cameras, in which conventional color filters (such as absorptive glass filters or dichroic thin film filters) are placed over the detector elements to perform spectral discrimination, typically using a 2×2 grid pattern of red, green, green, and blue filters. Since each detector element is filtered to record only one of three colors, two-thirds of the color data is missing from each pixel. (A demosaicing algorithm may be used to interpolate red, green, and blue values for each pixel.) This filter array approach may be applied to infrared systems; however, it is inefficient because much of the power incident on the detector array is thrown away (since each element is filtered to detect only one wavelength).

A dispersive system uses one dimension of a two-dimensional array to look at wavelength. The other dimension of the array can be used to obtain one spatial dimension. The array is then scanned to obtain the second spatial dimension. Thus, the system generates a spectrum for each pixel of the two-dimensional image. Scanning in one dimension, however, results in loss of sensitivity with respect to a staring array.

A two-color photovoltaic pixel uses a vertical stack of two p-n junctions, the one nearer the front (with respect to the direction in which the light is propagating) having a wider band gap, or cut off at a shorter wavelength. This approach can be configured to simultaneously look at two different frequency bands. However, it is difficult to scale to more than two bands.

Hence, a need exists in the art for an improved system or method for simultaneously imaging multiple frequency bands that is more efficient and more sensitive than prior approaches.

SUMMARY OF THE INVENTION

The need in the art is addressed by the optical detector pixel element of the present invention. The novel pixel element includes a metallic substrate having a plurality of resonant apertures, each aperture adapted to resonantly transmit electromagnetic energy in a distinct frequency band, and a plurality of detectors adapted to detect the energy transmitted by the apertures. Each aperture is adapted to collect energy incident on an area larger than the aperture and focus the energy into a smaller, localized region in which one or more of the detectors is placed. The plural apertures are positioned such that they collect energy incident on a substantially common area, but are of different sizes such that they are resonant to different frequencies. Energy in different frequency bands are therefore funneled through different apertures. In an illustrative embodiment, several identical pixel elements are joined together to form an array.

BRIEF DESCRIPTION OF THE DRAWINGS

FIG. 3a is a diagram showing the power flow of incident light on an illustrative pixel element designed in accordance with the present teachings, for incident light at the resonant frequency $f_1$ of the first aperture.

FIG. 3b is a diagram showing the power flow of incident light on an illustrative pixel element designed in accordance with the present teachings, for incident light at the resonant frequency $f_2$ of the second aperture.

FIG. 4 is a graph of power transmission vs. frequency of incident light for each resonant aperture of an illustrative pixel element designed in accordance with the present teachings.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention teaches a novel optical detector pixel element capable of simultaneously detecting multiple frequency bands within a single pixel. The device may be part of an imaging array, where each pixel element detects the optical intensity incident on the pixel area. Conventional imaging arrays typically have a single detector element per pixel. The imaging system of the present invention includes multiple detector elements per pixel, with each detector element adapted to detect a different frequency band.

In accordance with the present teachings, each detector element is made sensitive to a particular frequency band by filtering the incident radiation through a resonant aperture above the detector element. In the illustrative embodiment, each pixel collects the light incident on an area approximately 1 wavelength square, for a representative frequency of the detectable band. The light within each sub-band, as determined by the filtering by the resonant apertures, is transmitted through its respective filtering aperture and detected by its respective detector element.

Figure 1:
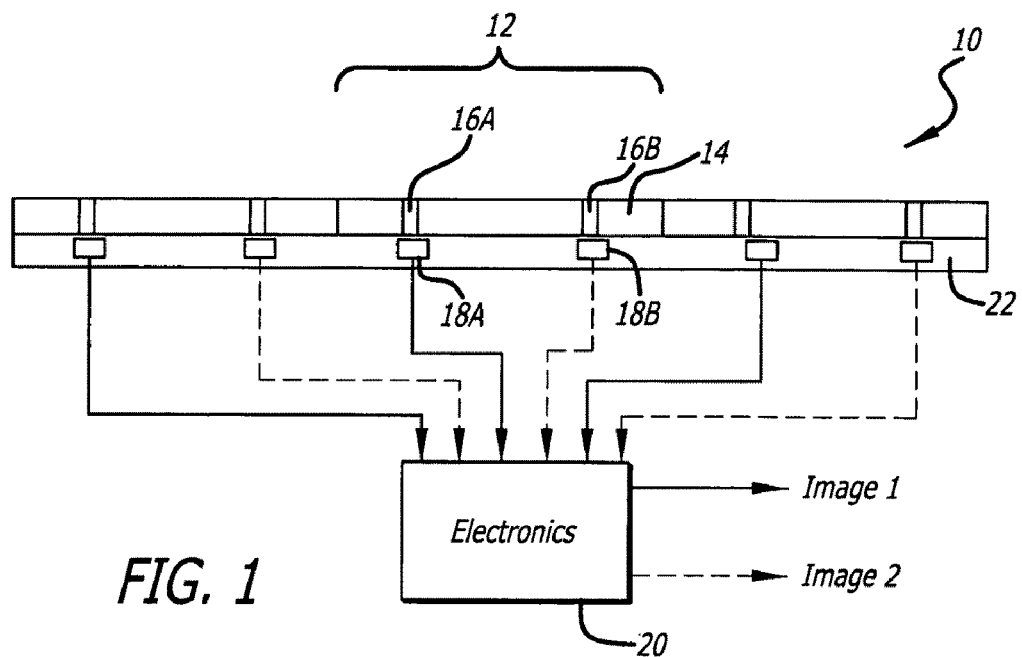
FIG. 1 is a simplified cross-sectional view of an imaging array designed in accordance with an illustrative embodiment of the present invention.

FIG. 1 is a simplified cross-sectional view of an imaging array 10 designed in accordance with an illustrative embodiment of the present invention. The imaging array 10 includes a plurality of pixel elements 12 joined together to form a one or two dimensional array (three pixel elements 12 are shown in FIG. 1). Each pixel element 12 includes a metallic substrate 14 having a plurality of resonant apertures 16 and a detector element 18 under each aperture 16 (in the illustrative embodiment of FIG. 1, each pixel element 12 includes two detector elements 18A and 18B under two resonant apertures 16A and 16B, respectively). The detector elements 18 include photodetector material adapted to absorb light transmitted by their respective apertures 16 and convert the received energy to an electrical signal. The detectors 18 are connected to readout electronics 20, which perform image processing on the detector output signals to form one or more output images.

Each resonant aperture 16 is adapted to collect light incident on the pixel element 12 and resonantly transmit the light in a distinct frequency band to its respective detector 18. A resonant aperture 16 collects energy incident on an area much larger than the aperture 16 and focuses the radiation into a smaller, localized region near the aperture 16 (the detector 18 is placed in this region). This allows the use of a detector 18 that is much smaller than the pixel area. In the illustrative embodiment, a resonant aperture 16 collects radiation incident on the metallic layer 14 across an area of approximately 1 wavelength square, for a representative frequency of the energy allowed by the aperture 16. For a more detailed description of resonant apertures, see the U.S. patent application entitled SUB-WAVELENGTH LOW-NOISE INFRARED DETECTORS, filed 5 May, 2007, by D. J. Gregoire, D. J. Kirby, and A. T. Hunter, application Ser. No. 11/801,249 the teachings of which are incorporated herein by reference. In the illustrative embodiment, the resonant apertures 16 are designed for infrared light; however, the present teachings may also be applied to other types of electromagnetic energy, including visible light.

Since the resonant apertures 16 and detector elements 18 are smaller than the pixel area, multiple apertures 16 and detectors 18 can be placed in each pixel element 12. (In conventional detector arrays, there is usually only one detector per pixel because the detector size is typically equal to the pixel size.) The multiple resonant apertures 16 of a pixel element 12 collect energy from approximately the same area, but energy in different frequency bands are funneled through different apertures 16.

In the illustrative embodiment, each aperture 16 of the pixel element 12 is designed to transmit energy in a different frequency band so that each detector 18 of the pixel element 12 receives and detects a different frequency band. The electronics 20 combines the signals from the detectors 18 of each pixel element 12 to generate images that show the intensity of energy received in each pixel in the different frequency bands. In the illustrative embodiment of FIG. 1, the imaging array 10 is configured as a dual-band detector. The first aperture 16A and first detector 18A of each pixel element 12 are configured to detect a first frequency band, and the second aperture 16B and second detector 18B of each pixel element 12 are configured to detect a second frequency band. The signals from the first detectors 18A of each pixel element 12 are combined by the electronics 20 to form a first image (showing the intensity of energy in the first frequency band) and the signals from the second detectors 18B of each pixel element 12 are combined by the electronics 20 to form a second image (showing the intensity of energy in the second frequency band).

The imaging array 10 may also be configured to detect more than two frequency bands without departing from the scope of the present teachings. A system for imaging in N different frequency bands would have N resonant apertures 16 in each pixel element 12. In the illustrative embodiment of FIG. 1, one detector element 18 is placed under each resonant aperture 16. An N-band detector would therefore have N detector elements 18 per pixel element 12, one detector element 18 under each aperture 16. Multiple detector elements 18 may also be placed under each resonant aperture 16 without departing from the scope of the present teachings.

In an illustrative embodiment, the imaging array 10 may be fabricated by applying a layer of metallic coating 14 with the desired pattern of resonant apertures 16 onto a dielectric substrate 22 (for example, by using lithographic techniques for electronic circuits). The detector elements 18 are embedded in the dielectric substrate 22 under their respective apertures 16. Alternatively, the imaging array 10 may be implemented by cutting out the apertures 16 in a metal sheet and placing the detectors 18 under each aperture without the dielectric layer 22 (i.e., the dielectric layer is air). Other implementations may also be used without departing from the scope of the present teachings.

Figure 2:
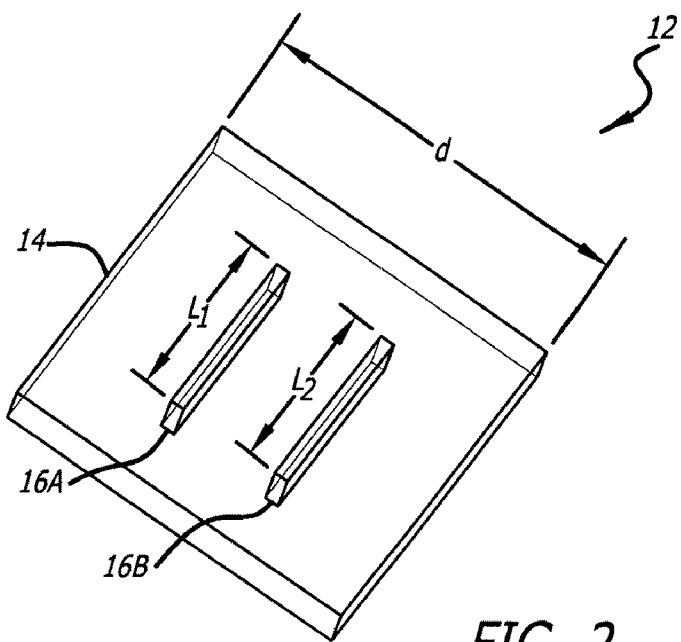
FIG. 2 is a drawing of the metallic substrate of an optical detector pixel element designed in accordance with an illustrative embodiment of the present invention.

FIG. 2 is a drawing of the metallic substrate of an optical detector pixel element 12 designed in accordance with an illustrative embodiment of the present invention, showing a square pixel element 12 having sides of length d (in the illustrative embodiment, d is equal to about 1 wavelength, for a representative frequency of the detectable bands). The pixel element 12 may be one of several identical pixel elements arranged in an array configuration (as shown in FIG. 1), or it may used alone.

In the embodiment of FIG. 2, the pixel element 12 is configured as a dual-band polarized detector with two resonant apertures 16A and 16B, which are in the form of slots. The slots 16A and 16B effectively detect light polarized parallel to the short axes of the slots. Each slot 16 has a different length that determines the sub-band frequency that is filtered through that slot 16. The width of the slot 16 is chosen to provide a desired bandwidth. The wider the slot 16, the wider the bandwidth of the resonance. This leads to a higher power transmitted through the slot 16 because a greater fraction of the incident spectrum is funneled through it at resonance. Ideally, one wants to trade off the power against frequency discrimination. For example, if BW is the resonant bandwidth of the slots and $\Delta f = f_2 - f_1$ is the frequency separation of the two resonances for a dual-band detector, then the slot width should be chosen such that $BW < \Delta f/2$. Thus, the larger $\Delta f$ is, the wider the slots can be and still achieve frequency discrimination between the slots.

Polarized light incident on the pixel element 12 at the slot's resonant frequency is transmitted through that slot 16. The resonant frequency $f_i$ for slot i is given by:

$$f_i = \frac{c}{2L_i \sqrt{\varepsilon}} \quad [1]$$

where c is the speed of light, $L_i$ is the length of slot i, and $\varepsilon$ is the effective permeability of the pixel structure 12. As shown in FIG. 2, the first slot 16A has a length $L_1$ and transmits a frequency band centered around a resonant frequency $f_1$. The second slot 16B has a length $L_2$ and transmits a frequency band centered around a resonant frequency $f_1$.

FIGS. 3a and 3b are diagrams showing the power flow of incident light on the illustrative pixel element 12 of FIG. 2, for incident light at the resonant frequencies $f_1$ and $f_2$, respectively. As shown in FIG. 3a, light 30 at the first resonant frequency $f_1$ incident on the pixel 12 is funneled into the first slot 16A and onto the first detector 18A. As shown in FIG. 3b, light 32 at the second resonant frequency $f_2$ incident on the pixel 12 is funneled into the second slot 16B and onto the second detector 18B. This filtering of the incident light occurs simultaneously, with light at the first resonant frequency $f_1$ traveling toward the first slot 16A while light at the second resonant frequency $f_2$ travels toward the second slot 16B. The power flow of incident light is similar for resonant apertures of all shapes (not just slots as shown in FIG. 2).

As shown in FIGS. 3a and 3b, each resonant aperture 16 collects energy incident on an area much larger than the aperture 16 and focuses the energy into a smaller, localized region near the aperture 16. For a single pixel element 12, both apertures 16A and 16B collect energy incident on the same area (across the pixel element 12). For an array configuration as in FIG. 1, each aperture 16 collects energy from an approximately 1 wavelength square region centered on the center of the aperture 16. If the apertures 16A and 16B are placed close together (less than 1 wavelength apart), they will collect energy from roughly the same area (i.e., the collection areas will have a large percentage of overlap).

FIG. 4 is a graph of power transmission vs. frequency of incident light for each resonant aperture 16A and 16B of the illustrative pixel element of FIG. 2. At frequency $f_1$, 100% of the power flows through the first aperture 16A, and at frequency $f_2$, 100% of the power flows through the second aperture 16B, to be absorbed by their respective detector elements 18A and 18B.

Figure 5A:
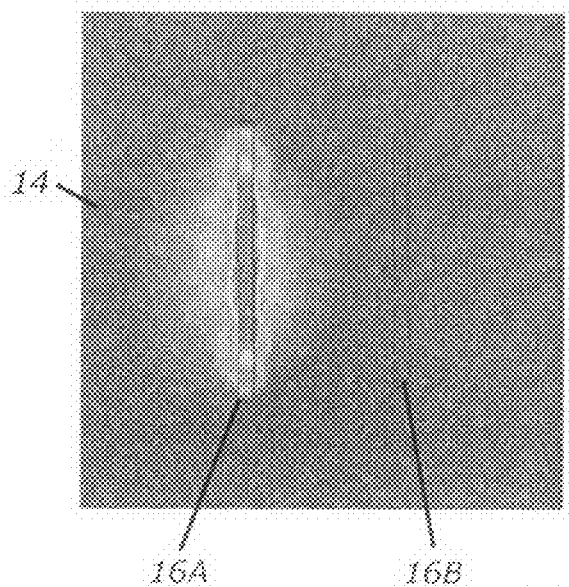
FIG. 5a is an illustrative false-color image of electric field intensity for an illustrative pixel element designed in accordance with the present teachings, for incident light at the resonant frequency $f_1$ of the first aperture.
Figure 5B:
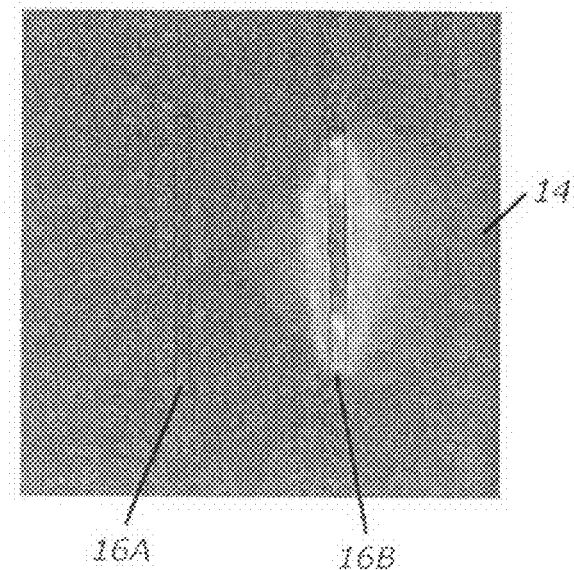
FIG. 5b is an illustrative false-color image of electric field intensity for an illustrative pixel element designed in accordance with the present teachings, for incident light at the resonant frequency $f_2$ of the second aperture.

FIG. 5a is an illustrative false-color image of electric field intensity for the illustrative pixel element 12 of FIG. 2, for incident light at the resonant frequency $f_1$ of the first slot 16A. FIG. 5b is an illustrative false-color image of electric field intensity for the illustrative pixel element 12 of FIG. 2, for incident light at the resonant frequency $f_2$ of the second slot 16B.

As shown in FIG. 5a, energy at the resonant frequency $f_1$ of the first slot 16A is focused around the first slot 16A. Most of the energy is concentrated at the center of the slot 16A, which is where the detector element 18A should be placed to receive most of the transmitted power. Substantially no energy is transmitted at this frequency by the second slot 16B. As shown in FIG. 5b, energy at the resonant frequency $f_2$ of the second slot 16B is focused around the second slot 16B. In this example, a very small amount of energy at the second resonant frequency $f_2$ leaks into the first slot 16A (crosstalk). More crosstalk between apertures 16 may occur if the apertures 16 are closer together. The apertures 16 should therefore be positioned far enough apart so that the crosstalk is at an acceptable level (the acceptable crosstalk level, and therefore the aperture spacing, is dependent on the imaging application and the degree of discrimination desired).

In the embodiments of FIGS. 2-5, the resonant apertures 16 are in the shape of straight slots. The apertures 16 may also be of other shapes without departing from the scope of the present teachings. For example, the resonant apertures 16 may be in a bowtie pattern as shown in FIGS. 6a and 6b.

Figure 6A:
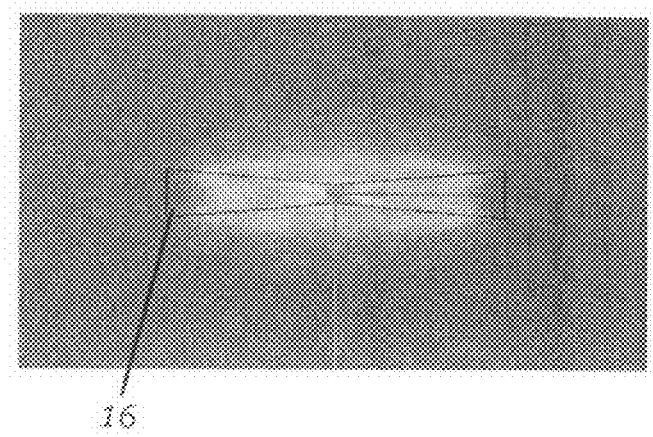
FIG. 6a is a false-color image of electric field intensity for an illustrative bowtie resonant aperture designed in accordance with the present teachings, at the resonant frequency of the aperture.
Figure 6B:
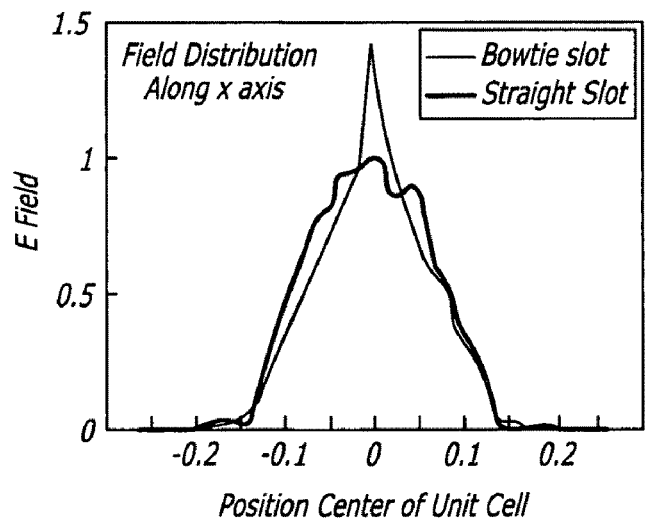
FIG. 6b is a graph of electric field intensity vs. distance from the center of the aperture, comparing an illustrative bowtie aperture and an illustrative straight slot aperture designed in accordance with the present teachings.

FIG. 6a is an illustrative false-color image of electric field intensity for a bowtie resonant aperture 16 designed in accordance with an illustrative embodiment of the present invention, for incident light at the resonant frequency of the aperture 16 (only one bowtie aperture is shown in FIG. 6). FIG. 6b is a graph of electric field intensity vs. distance from the center of the aperture, comparing an illustrative bowtie aperture and an illustrative straight slot aperture. The bowtie pattern confines the electric field more towards the center of the aperture 16 as compared to a straight slot (shown in FIGS. 5a and 5b). A bowtie aperture can have fields as much as 50% higher than an equivalent slot aperture. This higher field concentration allows the detector element 18 to be reduced in size and still absorb as much power (as a larger detector with a straight slot aperture).

Figure 7:
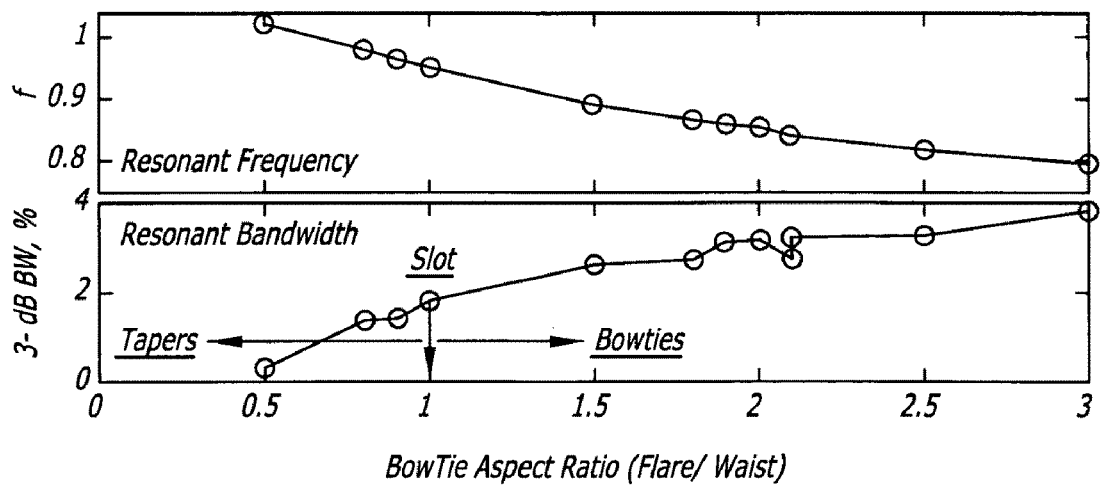
FIG. 7 is a graph of bandwidth and resonant frequency vs. flare-to-waist aspect ratio for an illustrative bowtie aperture designed in accordance with the present teachings.

Another feature of a bowtie aperture is that it may be configured to detect a larger bandwidth, if desired. FIG. 7 is a graph of bandwidth and resonant frequency vs. flare-to-waist aspect ratio for an illustrative bowtie aperture designed in accordance with the present teachings. (Note that the resonant frequency shown in FIG. 7 is scaled relative to the resonant frequency of a straight-slot aperture of the same length.) As the bowtie flare-to-waist ratio increases, its resonant bandwidth increases and its resonant frequency decreases.

Figure 8C:
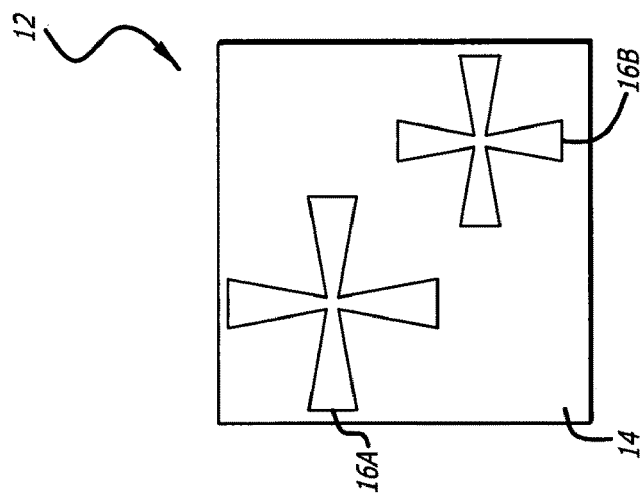
FIG. 8c is a simplified diagram showing the resonant apertures of an unpolarized dual-band detector pixel element designed in accordance with an illustrative embodiment of the present teachings.
Figure 8B:
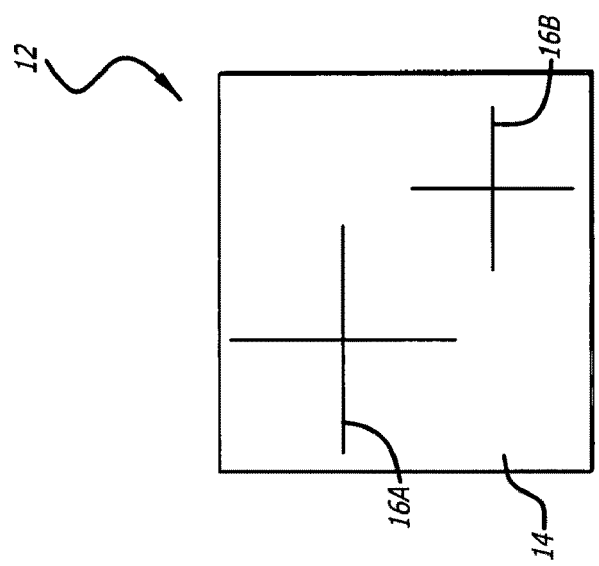
FIG. 8b is a simplified diagram showing the resonant apertures of an unpolarized dual-band detector pixel element designed in accordance with an illustrative embodiment of the present teachings.
Figure 8A:
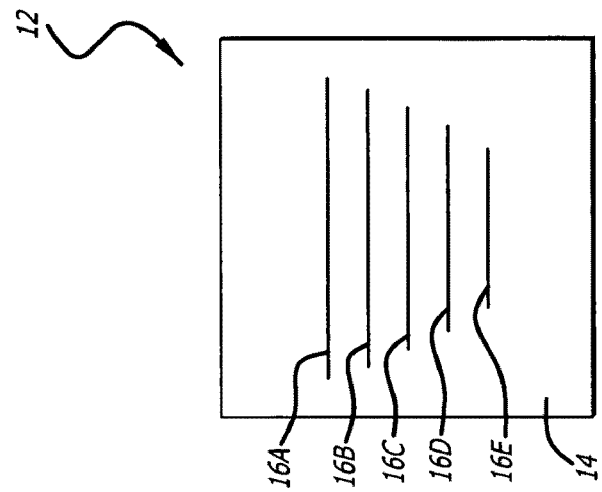
FIG. 8a is a simplified diagram showing the resonant apertures of a polarized multi-band detector pixel element designed in accordance with an illustrative embodiment of the present teachings.

FIGS. 8a-8c show various alternative embodiments for the pixel element 12. FIG. 8a is a simplified diagram showing the resonant apertures 16 of a polarized multi-band detector pixel element 12 designed in accordance with an illustrative embodiment of the present teachings. The polarized multi-band detector pixel element 12 includes several apertures 16 of varying lengths (in the embodiment of FIG. 8a, the pixel element 12 includes five straight slot apertures 16A, 16B, 16C, 16D, and 16E for detecting five different frequency bands).

The straight slot and bowtie slot apertures discussed above detect polarized light. In the case when unpolarized light is incident on the detector element, only that portion of light that is polarized parallel to the aperture's short axis is resonant with the aperture and detected. That means that 50% of the light is undetected, thus reducing the detector responsivity. However, it is possible to design the aperture such that it is resonant with unpolarized light.

FIG. 8b is a simplified diagram showing the resonant apertures 16 of an unpolarized dual-band detector pixel element 12 designed in accordance with an illustrative embodiment of the present teachings. In this embodiment, the two resonant apertures 16A and 16B are shaped as crossed slots, which are resonant with unpolarized light. The resonant field distributions in the crossed apertures is nearly identical to the slot apertures. A single detector element 18 can be used to detect both light polarizations.

FIG. 8c is a simplified diagram showing the resonant apertures 16 of an alternative non-polarized dual-band detector pixel element 12 designed in accordance with an illustrative embodiment of the present teachings. In this embodiment, the two resonant apertures 16A and 16B are shaped as crossed bowties, which are resonant with unpolarized light. Crossed bowtie elements confine the resonant fields more to the center of the cross apertures as compared with straight crossed slots.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,
What is claimed is:

1. An optical detector pixel comprising:
a metallic substrate having a plurality of resonant apertures, each aperture adapted to resonantly transmit electromagnetic energy in a different frequency band, wherein each aperture has a different size such that each aperture is resonant at a different frequency, and
first means for detecting said electromagnetic energy transmitted by said apertures;
wherein a surface of the metallic substrate is free of any protruding resonance structure between each of the plurality of apertures.

2. The detector pixel of claim 1, wherein said first means includes a plurality of detectors.

3. The detector pixel of claim 2, wherein at least one detector of the plurality of detectors is positioned beneath each aperture.

4. The detector pixel of claim 2, wherein each detector of the plurality of detectors is adapted to absorb electromagnetic energy transmitted by a respective aperture and convert said electromagnetic energy to an electrical signal.

5. The detector pixel of claim 1, wherein each aperture of the plurality of resonant apertures is adapted to collect energy incident on an area larger than said each aperture and focus said energy onto a smaller, localized region.

6. The detector pixel of claim 1, wherein one or more detectors are placed in a region of focused energy.

7. The detector pixel of claim 1, wherein two differently-sized apertures are positioned such that they collect energy incident on a substantially common area.

8. The detector pixel of claim 1, wherein said apertures are slots.

9. The detector pixel of claim 1, wherein said apertures are bowtie slots.

10. The detector pixel of claim 1, wherein said apertures are crosses.

11. The detector pixel of claim 1, wherein said apertures are bowtie crosses.

12. The detector pixel of claim 1, wherein said electromagnetic energy includes infrared energy.

13. The detector pixel of claim 1, wherein said plurality of resonant apertures comprise rectangular slots.

14. The detector pixel of claim 1, wherein the different size and a shape of said plurality of resonant apertures are configured to transmit non-polarized electromagnetic energy.

15. An optical detector pixel comprising:
a metallic substrate having a plurality of resonant apertures of different sizes, each aperture adapted to resonantly transmit light in a different frequency band, and
a plurality of detectors wherein at least one detector is positioned beneath each aperture and each detector is adapted to absorb light transmitted by a respective aperture and convert said light to an electrical signal;
wherein a surface of the metallic substrate is free of any protruding resonance structure between each of the plurality of apertures.

16. An imaging array comprising:
a plurality of pixels arranged in an array, each pixel including:
a metallic substrate having a plurality of resonant apertures of different sizes, each aperture adapted to resonantly transmit light in a different frequency band, and
a plurality of detectors wherein at least one detector is positioned beneath each aperture and each detector is adapted to absorb light transmitted by a respective aperture and convert said light to an electrical signal; and
a circuit adapted to receive said electrical signals from said pixels and to generate one or more output images;
wherein a surface of the metallic substrate is free of any protruding resonance structure between each of the plurality of resonant apertures.

17. A method for simultaneously imaging multiple frequency bands, the method comprising:
resonantly transmitting incident electromagnetic energy in each frequency band through a different resonant aperture formed in a metallic substrate, wherein each aperture has a different size such that each aperture transmits energy in a different frequency band, and
detecting said electromagnetic energy transmitted by said apertures;
wherein a surface of the metallic substrate is free of any protruding resonance structure between each of the different resonant apertures.

* * * * *